(12) United States Patent
Kim et al.

(10) Patent No.: US 7,323,710 B2
(45) Date of Patent: Jan. 29, 2008

(54) FIN FIELD EFFECT TRANSISTORS HAVING MULTI-LAYER FIN PATTERNS

(75) Inventors: Young-Pil Kim, Gyeonggi-do (KR); Sun-Ghil Lee, Gyeonggi-do (KR); Si-Young Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 511 days.

(21) Appl. No.: 10/870,743

(22) Filed: Jun. 17, 2004

(65) Prior Publication Data
US 2005/0184316 A1  Aug. 25, 2005

(30) Foreign Application Priority Data
Jul. 23, 2003 (KR) .................. 10-2003-0050569

(51) Int. Cl.
*H01L 29/06* (2006.01)
*H01L 31/00* (2006.01)
(52) U.S. Cl. .................. 257/19; 257/368; 257/E29.193
(58) Field of Classification Search .................. 257/55, 257/347, 19, 368, E29.193, E31.046, E31.049
See application file for complete search history.

(56) References Cited
U.S. PATENT DOCUMENTS

| | | | |
|---|---|---|---|
| 6,413,802 B1 | 7/2002 | Hu et al. ..................... 438/151 |
| 6,633,066 B1 | 10/2003 | Bae et al. ..................... 257/347 |
| 6,635,989 B1 | 10/2003 | Nilsson et al. ............... 313/512 |
| 6,767,793 B2 | 7/2004 | Clark et al. .................. 438/286 |
| 6,787,864 B2 * | 9/2004 | Paton et al. .................. 257/412 |
| 6,835,618 B1 * | 12/2004 | Dakshina-Murthy et al. .......................... 438/256 |
| 7,045,401 B2 * | 5/2006 | Lee et al. .................... 438/157 |
| 7,074,623 B2 * | 7/2006 | Lochtefeld et al. ............ 438/3 |

* cited by examiner

*Primary Examiner*—W. David Coleman
(74) *Attorney, Agent, or Firm*—Myers Bigel Sibley & Sajovec, PA (57) ABSTRACT

A fin field effect transistor has a fin pattern protruding from a semiconductor substrate. The fin pattern includes first semiconductor patterns and second semiconductor patterns which are stacked. The first and second semiconductor patterns have lattice widths that are greater than a lattice width of the substrate in at least one direction. In addition, the first and second semiconductor patterns may be alternately stacked to increase the height of the fin pattern, such that one of the first and second patterns can reduce stress from the other of the first and second patterns. The first and second semiconductor patterns may be formed of strained silicon and silicon-germanium, where the silicon-germanium patterns can reduce stress from the strained silicon patterns. Therefore, both the number of carriers and the mobility of carriers in the transistor channel may be increased, improving performance of the fin field effect transistor. Related methods are also discussed.

12 Claims, 7 Drawing Sheets

FIN FIELD EFFECT TRANSISTORS HAVING MULTI-LAYER FIN PATTERNS

CROSS REFERENCE TO RELATED APPLICATION

This application claims priority under 35 U.S.C. § 119 from Korean Patent Application No. 2003-50569, filed Jul. 23, 2003, the contents of which are incorporated herein by reference in their entirety.

FIELD OF THE INVENTION

The present invention generally relates to semiconductor integrated circuit devices, and more specifically, to fin field effect transistors and methods of forming the same.

BACKGROUND OF THE INVENTION

Field effect transistors are employed as basic discrete elements in fabricating semiconductor integrated circuit devices. Generally, a field effect transistor is composed of a gate electrode, a source region, and a drain region. The source and drain regions are located in a semiconductor substrate, with the source region separated from the drain region. The gate electrode is positioned over a channel region between the source and the drain regions. In the following specification, 'field effect transistor' will hereinafter be referred to as 'transistor'.

As semiconductor devices become more highly integrated, transistor size may be reduced, which may cause a variety of operational and structural problems. For example, shorter channel length may result in more easily induced punch-through effects between the drain and source regions. Also, controllability of the gate electrode may be reduced, which may result in leakage current between the drain region and the source region when the transistor is turned off. Recently, double-gate transistors have been developed to address the above problems. A double-gate transistor can include two gate electrodes positioned at both sides (both sidewalls and/or top/bottom surfaces) of a channel region thereof. Therefore, the double-gate transistor can effectively control both sides of the channel region.

Fin Field Effect Transistors (hereinafter referred to as 'Fin FETs') have also been developed. Fin FETs are a type of double-gate transistor, and are discussed, for example, in U.S. Pat. No. 6,413,802 entitled "Fin FET Transistor Structures Having a Double Gate Channel Extending Vertically From a Substrate And Methods of Manufacture", to Hu et al.

According to Hu, the Fin FET can include a silicon source region and a silicon drain region, which are separated from each other on a semiconductor substrate. A silicon fin may be formed on the semiconductor substrate between the silicon source region and the silicon drain region. The silicon source region may be electrically connected to the silicon drain region by the silicon fin when the transistor is turned on. The silicon fin, the silicon source region, and the silicon drain region may protrude from a surface of the semiconductor substrate, and a gate electrode may cross over the silicon fin. In other words, the gate electrode may pass over both sidewalls of the silicon fin. Therefore, the channel region of the Fin FET can include both sidewalls of the silicon fin, and the gate electrode can control both sides of the channel region.

Despite the difficulties associated with higher integration density of semiconductor devices, improvements in operational performance may also be desired. For example, increasing the amount of on-current may contribute to reduced response time for the transistor. Because the channel region includes both sidewalls of the silicon fin, the Fin FET can generate adequate on-current. However, this advantage may be limited by the size to which the Fin FET may be reduced.

SUMMARY OF THE INVENTION

According to some embodiments of the invention, a fin field effect transistor may include a fin pattern protruding from a semiconductor substrate. The fin pattern may have first and second semiconductor patterns which are stacked, and the first and second semiconductor patterns may have lattice widths that are greater than a lattice width of the substrate material in at least one direction.

In other embodiments, several first and second semiconductor patterns may be alternately stacked to increase the height of the fin pattern, and one of the first and second semiconductor patterns may reduce stress from the other of the first and second semiconductor patterns. Also, the lattice widths of the first and second patterns can be greater than the lattice width of the substrate in a direction along the channel length of the fin field effect transistor. In addition, one of the first and second semiconductor patterns may be formed of strained silicon, and the other of the first and second semiconductor patterns may be formed of silicon-germanium. The silicon-germanium pattern may reduce stress from the strained silicon pattern.

According to further embodiments, the transistor may further include a buffer semiconductor layer on the substrate and a relaxed semiconductor layer on the buffer layer. The substrate can be formed of silicon, the buffer layer can be formed of graded silicon-germanium, and the relaxed layer can be formed of silicon-germanium. Furthermore, the concentration of germanium in the buffer layer may gradually increase from bottom to top, and the concentration of germanium in the relaxed layer may be uniform and equivalent with a maximum concentration of germanium in the buffer layer. Also, one of the first and second semiconductor patterns may be formed of the same material as the relaxed layer. The fin pattern may further include a third semiconductor pattern formed of the same material as the relaxed layer.

In other embodiments, the transistor may further include a device isolation layer on the substrate surrounding a lower portion of the fin, and a gate electrode partially positioned on the device isolation layer. Also, the transistor can include a hard mask layer on the fin pattern.

According to some embodiments of the invention, a fin field effect transistor can include a semiconductor substrate having a first lattice width in first and/or second directions, a first semiconductor pattern having a second lattice width in the first and/or second direction that is greater than the first lattice width, and a second semiconductor pattern having a third lattice width in the first and/or second direction that is greater than the first lattice width. The first and second semiconductor patterns may be stacked to form a fin pattern protruding from the substrate.

In other embodiments according to the present invention, a method of forming a fin field effect transistor may include forming a fin pattern protruding from a semiconductor substrate. The fin pattern may include first and second semiconductor patterns which are stacked, wherein the first and second semiconductor patterns have lattice widths that are greater than a lattice width of the substrate material in at least one direction.

According to some embodiments, forming the fin pattern may includes forming several first and second semiconductor patterns which are alternately stacked, to increase the height of the fin pattern. One of the first and second semiconductor patterns may reduce stress from the other of the first and second semiconductor patterns. Also, the lattice widths of the first and second patterns may be greater than the lattice width of the substrate in a direction along the channel length of the fin field effect transistor. In addition, one of the first and second semiconductor patterns can be formed of strained silicon, and the other of the first and second semiconductor patterns can be formed of silicon-germanium. The silicon-germanium pattern can reduce stress from the strained silicon pattern.

In further embodiments, the method can include forming a buffer semiconductor layer on the substrate, and forming a relaxed semiconductor layer on the buffer layer. The substrate can be formed of silicon, the buffer layer can be formed of graded silicon-germanium, and the relaxed layer can be formed of silicon-germanium. The concentration of germanium in the buffer layer may gradually increase from bottom to top, and the concentration of germanium in the relaxed layer may be uniform and equivalent with a maximum concentration of germanium in the buffer layer. Also, one of the first and second patterns may be formed of the same material as the relaxed layer. The fin pattern can further include a third semiconductor pattern formed of the same material as the relaxed layer.

According to some embodiments, the method may include forming a device isolation layer on the substrate surrounding a lower portion of the fin, and forming a gate electrode partially positioned on the device isolation layer. Also, the method may include forming a hard mask layer on the fin pattern.

In still further embodiments according to the invention, a method of forming a fin field effect transistor includes forming a semiconductor substrate having a first lattice width in first and/or second directions, forming a first semiconductor pattern having a second lattice width in the first and/or second direction that is greater than the first lattice width, and forming a second semiconductor pattern having a third lattice width in the first and/or second direction that is greater than the first lattice width. The first and second patterns may be stacked to form a fin pattern protruding from the substrate.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will be understood that if part of an element, such as a surface of a conductive line, is referred to as "outer," it is closer to the outside of the integrated circuit than other parts of the element. Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

It will be understood that although the terms first and second are used herein to describe various embodiments, regions, layers and/or sections, these embodiments, regions, layers and/or sections should not be limited by these terms. These terms are only used to distinguish one embodiment, region, layer or section from another embodiment, region, layer or section, and not to suggest that one is preferred over another. Thus, a first embodiment, region, layer or section discussed below could be termed a second embodiment, region, layer or section, and similarly, a second embodiment, region, layer or section may be termed a first embodiment, region, layer or section without departing from the teachings of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 1:
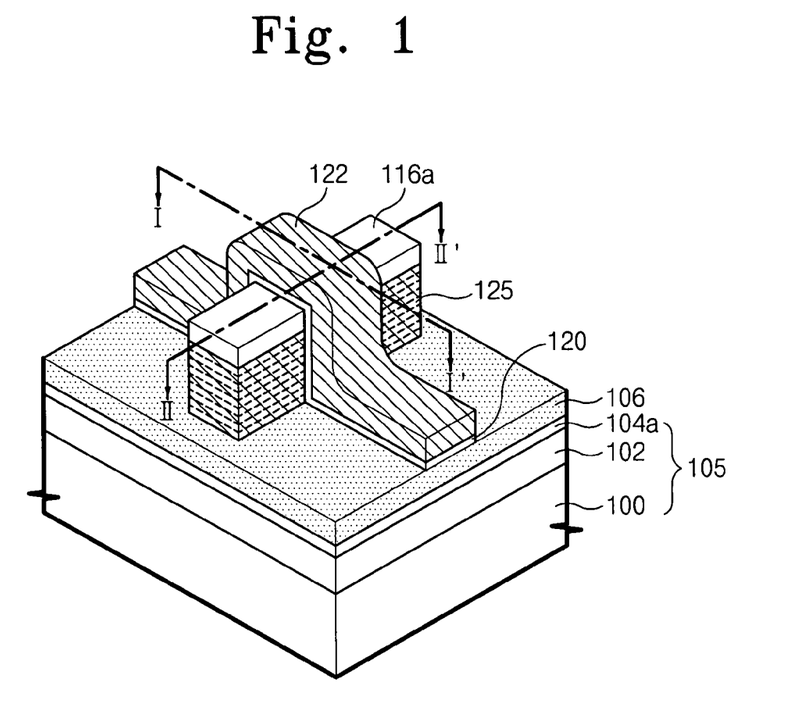
FIG. 1 is a perspective view of a Fin Field Effect Transistor (Fin FET) according to some embodiments of the present invention.
Figure 2:
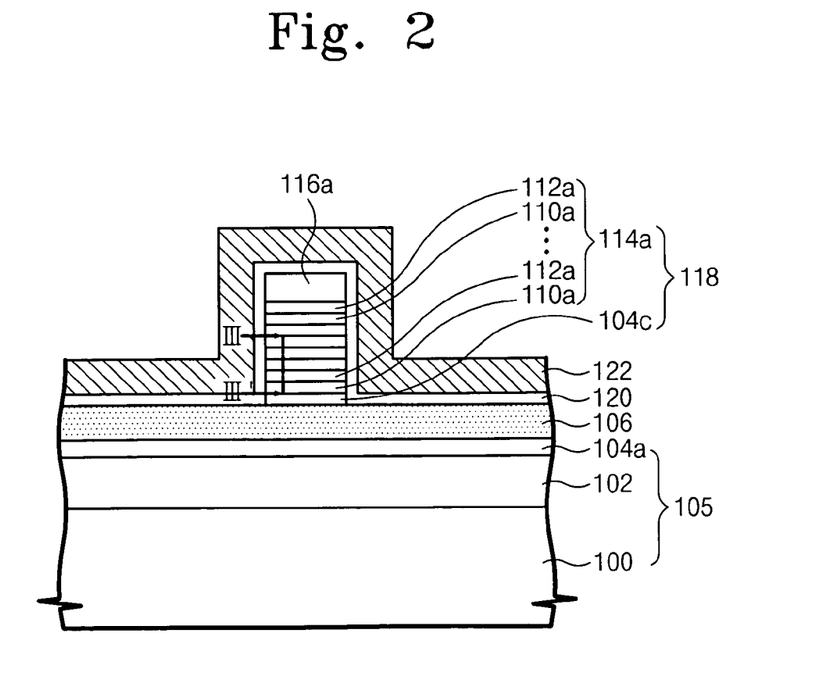
FIG. 2 is a cross-sectional view of the Fin FET, taken along line I-I' of FIG. 1.

FIG. 1 is a perspective view of a Fin Field Effect Transistor (Fin FET) according to some embodiments of the present invention. FIG. 2 is a cross-sectional view of the Fin FET taken along line I-I' of FIG. 1, and FIG. 3 is a cross-sectional view of the Fin FET taken along line II-II' of FIG. 1.

Figure 3:
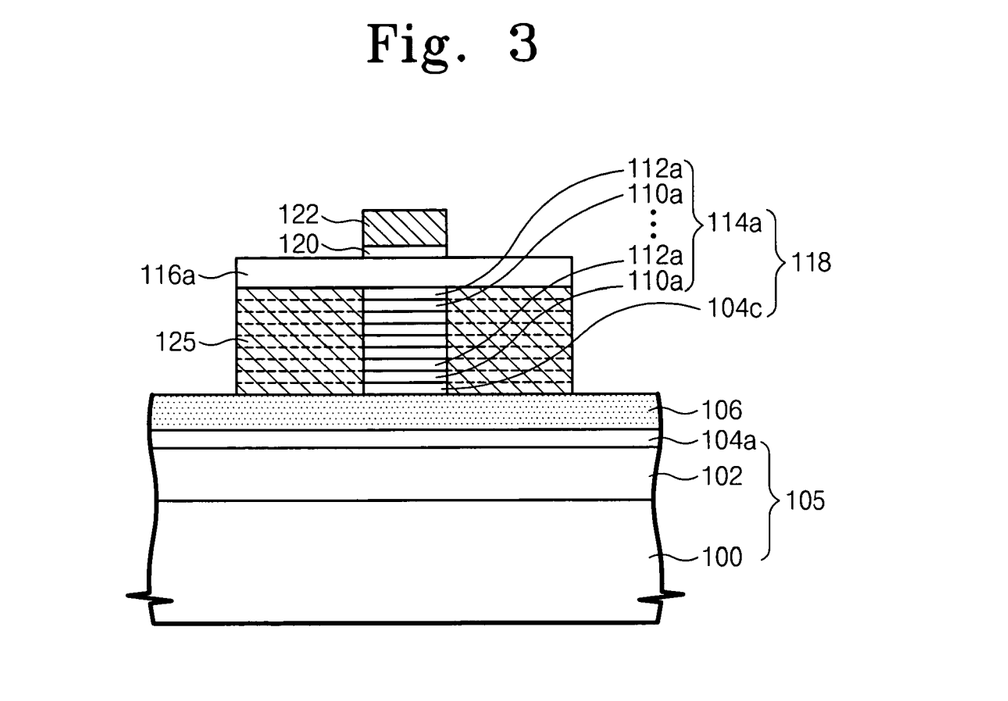
FIG. 3 is a cross-sectional view of the Fin FET, taken along line II-II' of FIG. 1.

Referring to FIGS. 1, 2 and 3, a buried insulation layer 106 is formed on a support substrate 105, and a fin pattern 118 and a hard mask pattern 116a are stacked on the buried insulation layer 106. The buried insulation layer 106 may be formed of silicon oxide, germanium oxide, or a compound of silicon oxide and germanium oxide.

The support substrate 105 may include a semiconductor substrate 100, and a buffer semiconductor layer 102 and a relaxed semiconductor layer 104a stacked on the semiconductor substrate 100. Preferably, the semiconductor substrate 100 is made of silicon.

The buffer semiconductor layer 102 preferably buffers stress (such as tensile stress) between the semiconductor substrate 100 and the relaxed semiconductor layer 104a. The relaxed semiconductor layer 104a is preferably free from stress. For example, it is desirable to form the buffer semiconductor layer 102 of graded silicon-germanium, and the relaxed semiconductor layer 104a of relaxed silicon-germanium. The concentration of germanium in the graded silicon-germanium buffer layer 102 gradually increases from bottom to top, while it is uniform throughout the relaxed silicon-germanium layer 104a. It is preferable for the germanium concentration of the relaxed layer 104a to be equivalent to the maximum concentration of germanium at the top of the graded silicon-germanium buffer layer 102.

As germanium atoms are larger than silicon atoms, a crystalline compound that includes both silicon and germanium atoms will have a lattice width greater than the lattice width of a crystalline layer made only of silicon atoms (i.e. general crystalline silicon). Therefore, the lattice widths of the relaxed semiconductor layer 104a, including silicon and germanium atoms, are greater than that of the semiconductor substrate 100 made only of silicon atoms. Moreover, the relaxed semiconductor layer 104a may have lattice widths in each of three dimensions, all of which may be greater than those of the semiconductor substrate 100. As used herein, the term "direction" may be used to refer to any of the three dimensions.

The lattice widths of the buffer semiconductor layer 102, made of graded silicon-germanium, gradually increase towards the top surface in accordance with the gradual increase of the germanium concentration therein. As such, the buffer semiconductor layer 102 may reduce tension between the semiconductor substrate 100 and the relaxed semiconductor layer 104a due to the different lattice widths.

The fin pattern 118 includes at least a multi-layered pattern 114a. The multi-layered pattern 114a preferably includes a plurality of first semiconductor patterns 110a and second semiconductor patterns 112a which are alternately stacked thereon, as shown in FIG. 2. Here, the first and second semiconductor patterns 110a and 112a have lattice widths that are greater than the lattice width of silicon in at least one direction. Preferably, a third semiconductor pattern 104c is interposed between the multi-layered pattern 114a and the buried insulation layer 106. The third semiconductor pattern 104c has sidewalls that are aligned with the multi-layered pattern 114a, and is preferably made of the same material (and thus has the same lattice widths) as the relaxed semiconductor layer 104a. Thus, the fin pattern 118 may be formed by the stacked combination of the third semiconductor pattern 104c and the multi-layered pattern 114a.

Preferably, one of the first and second semiconductor patterns 110a and 112a is also made of the same material (and thus has the same lattice widths) as the relaxed semiconductor layer 104a, which is the same material as the third semiconductor pattern 104c. More particularly, one of the first and second semiconductor patterns 110a and 112a is preferably made of silicon-germanium, while the other is preferably made of strained silicon.

The strained silicon pattern has the same horizontal lattice widths (i.e. parallel to the top surface of layer 104a) as the relaxed semiconductor layer 104a (and/or the third semiconductor pattern 104c). That is, the strained silicon pattern is arranged with its lattice widths extended parallel to the top surface of the relaxed semiconductor layer 104a. However, the vertical lattice widths (i.e. perpendicular to the top surface of the relaxed semiconductor layer 104a) of the strained silicon pattern may be the same as the lattice width of silicon.

The silicon-germanium pattern in the multi-layered pattern 114a preferably has the same germanium concentration as the relaxed semiconductor layer 104a (or the third semiconductor pattern 104c). Therefore, the silicon-germanium pattern is subjected to reduced stress for the same lattice widths as the relaxed semiconductor layer 104a (or the third semiconductor pattern 104c).

Consequently, the strained silicon patterns in the fin pattern 118 have lattice widths extending along a horizontal direction, and the silicon-germanium patterns and third semiconductor pattern 104c in the fin pattern 118 reduce stress that may be caused by the strained silicon patterns. In other words, although the strained silicon patterns may cause stress, the fin pattern 118 can have a sufficient height because the silicon-germanium patterns can act as a buffer to reduce stress. The use of a strained silicon layer on a relaxed or unstrained silicon germanium layer is also described, for example, in commonly assigned U.S. Pat. No. 6,633,066 to Bae et al., the disclosure of which is hereby incorporated herein by reference.

The topmost and bottommost layers of the multi-layered pattern 114a may be formed of strained silicon. Alternatively, the topmost and bottommost layers of the multi-layered pattern 114a may be formed of silicon-germanium. Additionally, one of the topmost and bottommost layers of the multi-layered pattern 114a may be made of strained silicon, and the other may be made of silicon-germanium.

The hard mask pattern 116a is formed on top of the multi-layered pattern 114a, and may be made of nitride. In addition, the hard mask pattern 116a may include a buffer oxide layer between the nitride and the multi-layered pattern 114a.

A gate electrode 122 crosses over the fin pattern 118 and the hard mask pattern 116a. A gate insulation layer 120 is formed between the fin pattern 118 and the gate electrode 122. The gate electrode 122 may be made of doped polysilicon, polycide, or metal, and the gate insulation layer 120 may be made of oxide. The gate insulation layer 120 may be formed only on the exposed surface of the fin pattern 118, i.e. the sidewalls. The gate insulation layer 120 may also be formed between the hard mask pattern 116a and the gate electrode 122. In this case, only the sidewalls of the fin pattern 118 under the gate electrode 122 correspond to a channel region of a Fin FET.

Alternatively, the hard mask pattern 116a may be omitted. In this case, both the top surface and the sidewalls of the fin pattern 118 under the gate electrode 122 may correspond to the channel region of the Fin FET. Also, the gate insulation layer 120 is formed between sidewalls of the fin pattern 118 and the gate electrode 122, and between the top surface of the fin pattern 118 and the gate electrode 122.

Preferably, the respective patterns 104c, 110a and 112a in the fin pattern 118 have lattice widths that are greater than the lattice width of silicon along the length of the channel in the fin pattern 118 under the gate electrode 122. A couple of impurity diffusion layers 125 are also formed in the fin pattern on both sides of the gate electrode, and are assigned as source/drain regions.

In the above Fin FET, the fin pattern 118 is composed of patterns 104c, 110a, and 112a having lattice widths greater than the lattice width of silicon. That is, the fin pattern 118 is formed by alternately stacking silicon-germanium patterns and strained silicon patterns. Therefore, the mobility of carriers in the channel region of the fin pattern 118 can be increased, because the number of lattices per unit volume (i.e. lattice density) may be reduced. In addition, the carriers in the channel region may be increased in number. As a result, the on-current in the Fin FET can be increased, thereby improving its performance.

Figure 4:
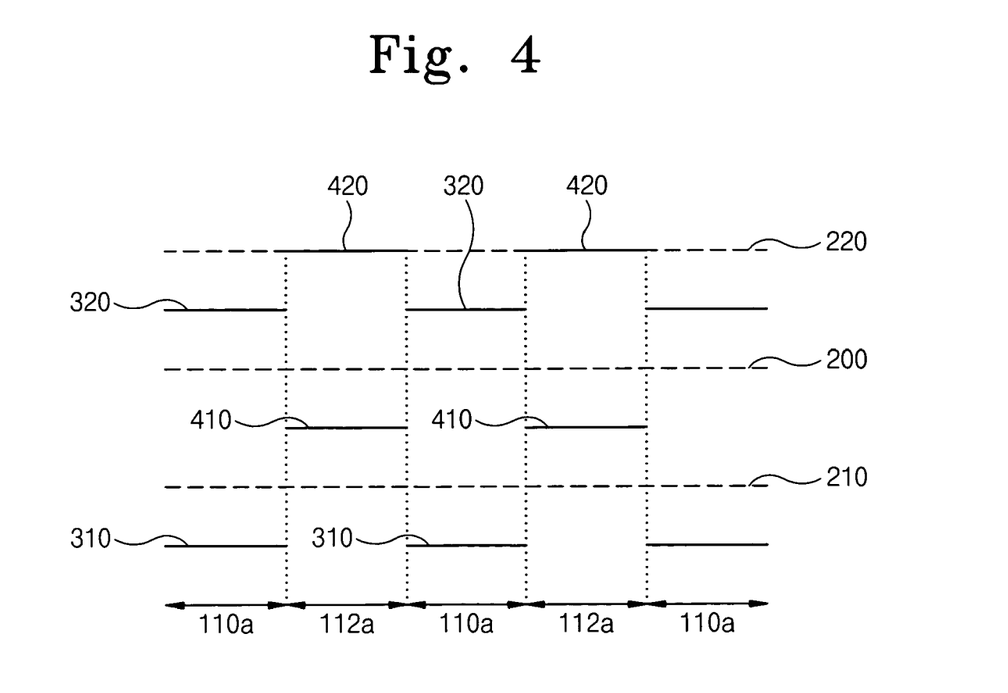
FIG. 4 is an energy band diagram of the Fin FET of FIG. 1.

FIG. 4 is an energy band diagram for the channel region of the Fin FET of FIG. 2. As discussed earlier, the first semiconductor pattern 110a may be formed of strained silicon, and the second semiconductor pattern 112a may be formed of silicon-germanium. Also, the relaxed semiconductor layer 104a, the third semiconductor pattern 104c, and the second semiconductor pattern 112a may all be formed of the same material.

Referring to FIG. 4, dotted line 200 represents the Fermi energy level, dotted line 210 is the valence band of silicon, and dotted line 220 is the conduction band of silicon. Hereinafter, dotted lines 210 and 220 are referred to as the standard valence band and the standard conduction band, respectively.

Lines 310 and 320 respectively correspond to the valence and conduction bands assigned to the first semiconductor pattern 110a formed of strained silicon, hereinafter referred to as the first valence and conduction bands. Lines 410 and 420 respectively correspond to the valence and conduction bands assigned to the second semiconductor pattern 112a formed of silicon-germanium, hereinafter referred to as the second valence and conduction bands.

Still referring to FIG. 4, the first conduction band 320 of the first semiconductor pattern 110a is lower than the standard conduction band 220 due to the greater lattice width of the strained silicon pattern. As such, the probability of electrons at the first conduction band 320 is higher than at the standard conduction band 220. Also, the second conduction band 420 is almost equivalent to the standard conduction band 220, regardless of the germanium concentration of the silicon-germanium pattern. Therefore, the probability of electrons in the second conduction band 420 is almost equivalent to that of the standard conduction band 220. This means that the channel region in the fin pattern 118 is larger than that of a conventional fin pattern, such that the on-current of the Fin FET may be increased.

Meanwhile, the first valence band 310 is lower than the standard valence band 210. As such, the probability of holes at the first valence band 310 is lower than that of the standard valence band 210. However, the second valence band 410 is higher than the standard valence band 210, which can mean holes are more likely to occupy the second valence band 410 than the standard valence band 210. Therefore, although the fin pattern 118 is a channel region of a PMOS transistor, hole concentration in the channel region may not be reduced. As a result, the Fin FET can be suitable for forming a CMOS device having NMOS and PMOS transistors.

Moreover, as discussed above, the fin pattern 118 includes alternating layers of strained silicon patterns and silicon-germanium patterns. Therefore, due to the strained silicon patterns, the number and mobility of carriers in the channel region under the fin pattern 118 is increased. In addition, the fin pattern 118 can be formed to a greater height than a conventional fin pattern, by using the silicon-germanium patterns as buffers. As a result, the on-current of the Fin FET may be increased, improving performance.

Figure 5:
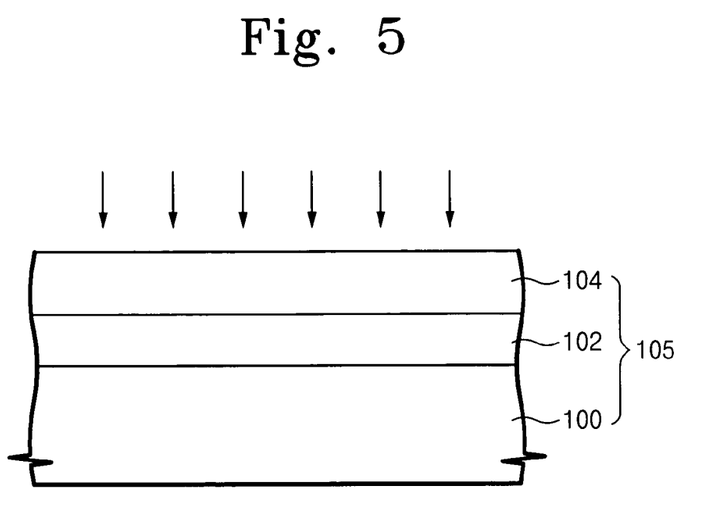
FIG. 5 through FIG. 7 are cross-sectional views illustrating methods of forming the Fin FET shown FIG. 1 according to some embodiments of the invention, taken along line I-I' of FIG. 1.
Figure 6:
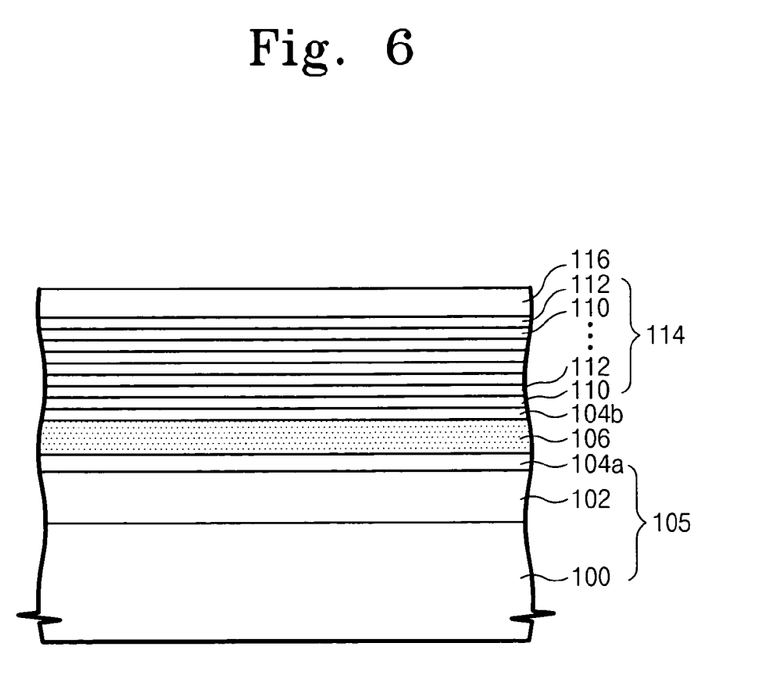
Figure 7:
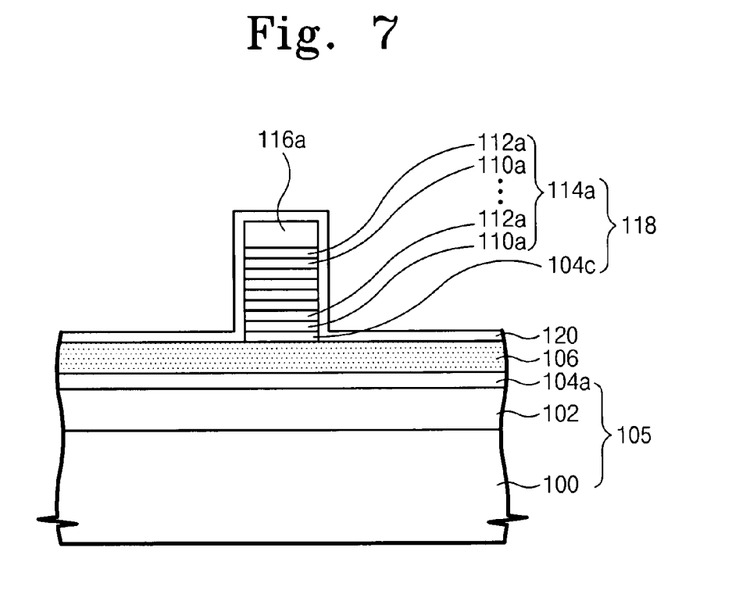

FIG. 5 through FIG. 7 are cross-sectional views illustrating methods of forming the Fin FET of FIG. 1, taken along line I-I' of FIG. 1.

Referring to FIG. 5, a support substrate 105 is composed of a semiconductor substrate 100, a buffer semiconductor layer 102, and a relaxed semiconductor layer 104. The buffer semiconductor layer 102 is formed on the semiconductor substrate 100, and then the relaxed semiconductor layer 104 is formed on the buffer semiconductor layer 102.

Preferably, the semiconductor substrate 100 is made of silicon. The relaxed semiconductor layer 104 is formed from a material that has lattice widths greater than the lattice width of silicon, and is free from stress. The buffer semiconductor layer 102 is formed from a material that can reduce stress caused by differences between lattice widths of the semiconductor substrate 100 and the relaxed semiconductor layer 104. Preferably, the buffer semiconductor layer 102 is made of graded silicon-germanium, and the relaxed semiconductor layer 104 is made of relaxed silicon-germanium.

The graded silicon-germanium layer may be formed by an epitaxial growth process which gradually increases the amount of germanium source gases. As a result, the germanium concentration of the graded silicon-germanium layer gradually increases from bottom to top. That is, the lattice widths of the graded silicon-germanium layer gradually increase from the bottom surface of the layer to the top surface thereof.

The relaxed silicon-germanium layer may be formed on the buffer semiconductor layer 102 by an epitaxial growth process using a uniform amount of germanium source gases. Therefore, the relaxed silicon-germanium layer has uniform germanium concentration throughout. In particular, the germanium concentration of the relaxed silicon-germanium layer may be equivalent to the maximum germanium concentration of the graded silicon-germanium layer. As such, the graded silicon-germanium layer may reduce stress caused by differences between the lattice widths of the silicon substrate and the relaxed silicon-germanium layer. The relaxed silicon-germanium layer is subjected to reduced stress and has lattice widths greater than the lattice width of the silicon substrate.

Referring to FIG. 6, a buried insulation layer 106 is formed on the relaxed semiconductor layer 104 by implanting predetermined element ions into the support substrate 105. The top surface of the buried insulation layer 106 is thus formed a predetermined depth below the top surface of the relaxed semiconductor layer 104. As a result, a first relaxed semiconductor layer 104a, the buried insulation layer 106, and a second relaxed semiconductor layer 104b are stacked on the buffer semiconductor layer 102. Preferably, the predetermined element ions are oxygen ions, so that the buried insulation layer 106 comprises silicon oxide or germanium oxide.

Still referring to FIG. 6, a multi-level layer 114 is formed on the second relaxed semiconductor layer 104b. The multi-level layer 114 includes of a plurality of first semiconductor layers 110 and second semiconductor layers 112 which are alternately stacked, as shown in FIG. 6. Preferably, one of the first and second semiconductor layers 110 and 112 is formed from strained silicon via an epitaxial growth process, and the other of the first and second semiconductor layers 110 and 112 is a silicon-germanium layer formed by an epitaxial growth process.

For example, when the first and second semiconductor layers 110 and 112 are formed, the strained silicon layer is formed on the second relaxed semiconductor layer 104b by an epitaxial growth process using silicon source gases. Due to the greater lattice width of the second relaxed semiconductor layer 104b, horizontal lattice widths of the strained silicon layer are the same as that of the second relaxed semiconductor layer 104b. In other words, the horizontal lattice width of strained silicon is greater than the lattice widths of conventional crystalline silicon.

After forming the strained silicon layer to a predetermined thickness, a silicon-germanium layer is formed on the strained silicon layer by an epitaxial growth process, using silicon source gases and germanium source gases. At this time, the germanium concentration of the silicon-germanium layer is equal to that of the second relaxed semiconductor layer 104b. In other words, the second semiconductor layer 112 may be formed of same material as the second relaxed semiconductor layer 104b. Therefore, lattice widths of the second semiconductor layer 112 are equal to the lattice widths of the second relaxed semiconductor layer 104b. The multi-level layer 114 is formed by alternately forming strained silicon layers and silicon-germanium layers. The second relaxed semiconductor layer 104b and the silicon-germanium layers can reduce stress from the strained silicon layer.

In some embodiments, the first semiconductor layer 110 may be formed of silicon-germanium, and the second semiconductor layer 112 may be formed of strained silicon. Further, the topmost and the bottommost layers of the multi-level layer 114 may be formed of the first semiconductor layers 110. Alternatively, the topmost and the bottom layers may be formed of the second semiconductor layers 112. Otherwise, one of the topmost and bottommost layers may be formed of the first semiconductor layer 110, and the other may be formed of the second semiconductor layer 112.

Still referring to FIG. 6, a hard mask layer 116 is formed on the multi-level layer 114. The hard mask layer 116 is made of a material having an etch selectivity with respect to the multi-level layer 114. In addition, the hard mask layer 116 may function as an anti-reflecting layer. For example, the hard mask layer 116 may be formed of silicon nitride. The hard mask layer 116 may further include a buffer oxide layer under the silicon nitride.

Referring to FIG. 7, the hard mask layer 116, the multi-level layer 114, and the second relaxed semiconductor layer 104b are sequentially patterned to form, a hard mask pattern 116a, a multi-layered pattern 114a, and a second relaxed semiconductor pattern 104c, respectively. The multi-layered pattern 114a includes of a plurality of alternately stacked first semiconductor patterns 110a and second semiconductor patterns 112a, as shown in FIG. 7. One of the first and second semiconductor patterns 110a and 112a is made of strained silicon, and the other is made of silicon-germanium. The second relaxed semiconductor pattern 104c and the multi-layered pattern 114a make up the fin pattern 118. Since the fin pattern 118 is formed on the buried insulation layer 106, the fin pattern 118 is isolated from other fin patterns.

Still referring to FIG. 7, a gate insulation layer 120 is formed on at least the exposed surface of the fin pattern 118. The gate insulation layer 120 may be formed by thermal oxidation of the support substrate 105 having the fin pattern 118, so that the gate insulation layer 120 may be formed of silicon oxide and germanium oxide.

Alternatively, a surface semiconductor layer is formed on the support substrate 105 by chemical vapor deposition or epitaxial growth. The surface semiconductor layer may be made of silicon. Then, the gate insulation layer 120 may be formed by thermal oxidation of the surface semiconductor layer, so that the gate insulation layer 120 may be formed of silicon oxide.

The gate electrode 122 shown in FIG. 1 and FIG. 2 is then formed. The gate electrode 122 crosses over the fin pattern 118 and the hard mask pattern 116a. When the gate electrode 122 is formed, the gate insulation layer 120 may be patterned with the gate electrode 122.

A couple of impurity diffusion layers 125, as shown in FIGS. 1 and 3, are formed in the fin pattern 118 at both sides of the gate electrode 122 by implanting impurity ions. The impurity diffusion layers 125 correspond to source and drain regions.

In further embodiments of the present invention, a Fin FET employing a device isolation method will be described.

Figure 8:
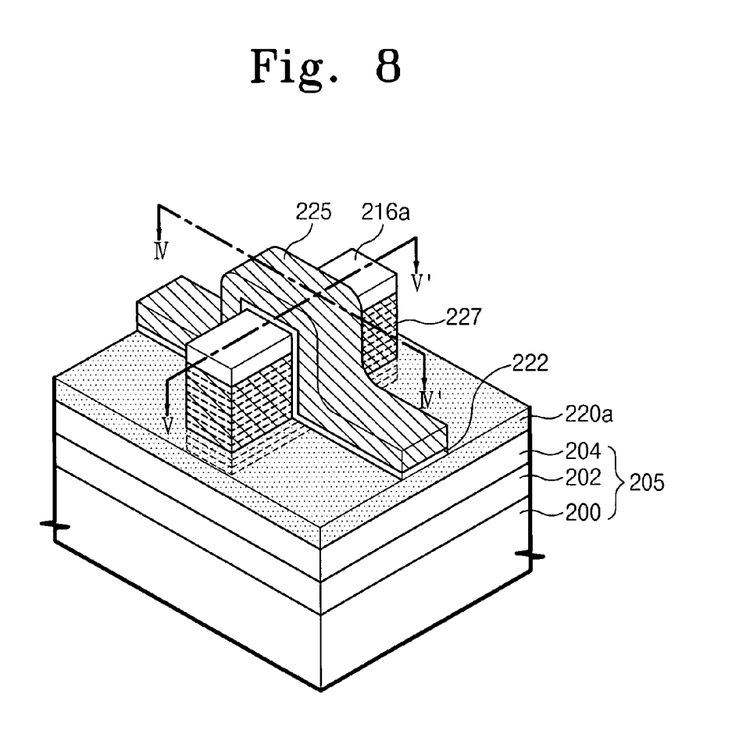
FIG. 8 is a perspective view of a Fin FET according to some embodiments of the present invention.
Figure 9:
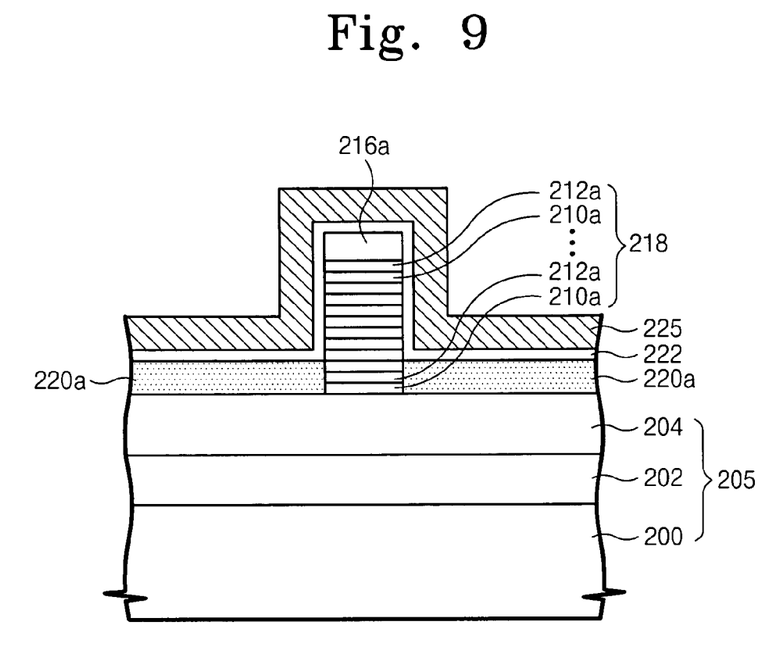
FIG. 9 is a cross-sectional view of the Fin FET, taken along line IV-IV' of FIG. 8.
Figure 10:
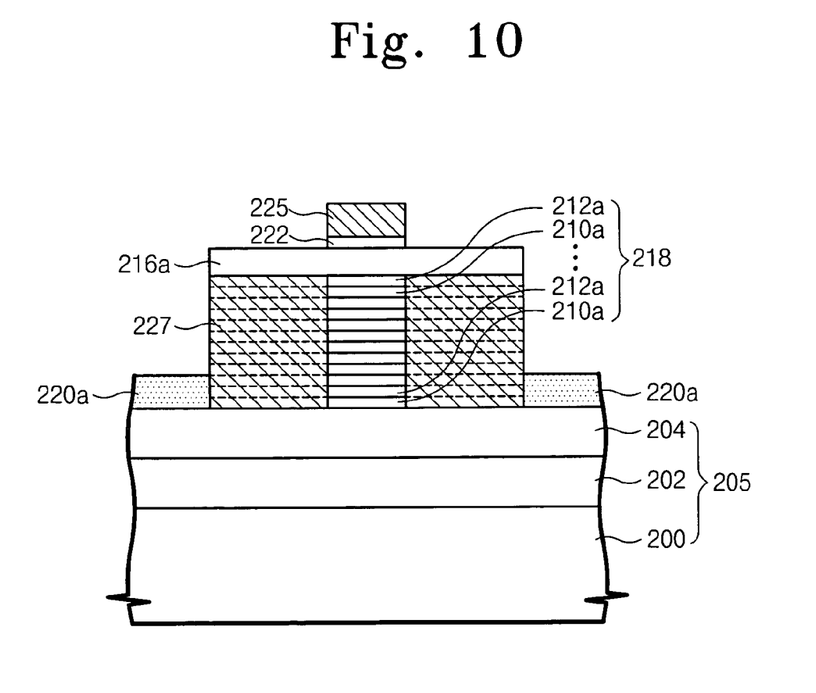
FIG. 10 is a cross-sectional view of the Fin FET, taken along line V-V' of FIG. 8.

FIG. 8 is a perspective view of a Fin FET according to further embodiments of the present invention, and FIG. 9 is a cross-sectional view of a Fin FET, taken along line IV-IV' of FIG. 8. FIG. 10 is a cross-sectional view of a Fin FET, taken along line V-V' of FIG. 8.

Referring to FIG. 8 through FIG. 10, a fin pattern 218 and a hard mask pattern 216a are formed on a support substrate 205. The sidewalls of the hard mask pattern 216a are aligned with the sidewalls of the fin pattern 218.

The support substrate 205 may include a semiconductor substrate 200, a buffer semiconductor layer 202, and a relaxed semiconductor layer 204. The relaxed semiconductor layer 204 is formed on the buffer semiconductor layer 202 on the semiconductor substrate 200.

Preferably, the semiconductor substrate 200 is made of silicon, the buffer semiconductor layer 202 is made of graded silicon-germanium, and the relaxed semiconductor layer 204 is made of relaxed silicon-germanium. The graded silicon-germanium layer and the relaxed silicon-germanium layer may be formed in the same manner as fully described above in prior embodiments. That is, the graded silicon-germanium layer has lattice widths that gradually increase from bottom to top, and the relaxed silicon-germanium layer has uniform lattice widths throughout. The lattice widths of the relaxed silicon-germanium layer are equal to the maximum lattice widths of the graded silicon-germanium layer. The buffer semiconductor layer 202 may reduce stress caused by differences between the lattice widths of the semiconductor substrate 200 and the lattice widths of the relaxed semiconductor layer 204, as was also described above.

The fin pattern 218 includes of a plurality of alternately stacked first semiconductor patterns 210a and second semiconductor patterns 212a. The first and second semiconductor patterns 210a and 212a have lattice widths that are greater than the lattice width of conventional silicon in at least one direction. Preferably, one of the first and second semiconductor patterns 210a and 212a is made of strained silicon, and the other is made of silicon-germanium.

The strained silicon pattern and the silicon-germanium pattern may be include the same properties as fully described above in other embodiments. That is, the horizontal lattice widths of the strained silicon pattern are equal to the lattice widths of the relaxed semiconductor layer 204, and are greater than the lattice width of conventional silicon. Also, the silicon-germanium pattern has the same lattice widths as that of the relaxed semiconductor layer 204, and is subjected to reduced stress (such as tensile stress). The silicon-germanium pattern may reduce tensile stress induced by the strained silicon pattern.

The fin pattern 218 may have the same topmost and bottommost layers as that of the multi-layered pattern 114a of FIG. 2.

The hard mask pattern 216a may be formed of silicon nitride or buffer oxide/silicon nitride. A gate electrode 225 crosses over the fin pattern 218 and the hard mask pattern 216a, and a gate insulation layer 222 is formed between the fin pattern 218 and the gate electrode 225. In addition, the gate insulation layer may be formed between the hard mask pattern 216a and the gate electrode 225. A couple of impurity diffusion layers 227 are formed in the fin pattern 218 on both sides of the gate electrode 225. The impurity diffusion layers 227 correspond to source and drain regions.

A device isolation layer 220a is formed on the relaxed semiconductor layer 204 and surrounds a lower portion of the fin pattern 218. A portion of the gate electrode 225 located at the sides of the fin pattern 218 is positioned on the device isolation layer 220a. Therefore, the Fin FET, including the fin pattern 218, is isolated from other Fin FETs. The device isolation layer 220a may be made of an insulation layer such as silicon oxide.

In the above the Fin FET, the fin pattern 218 may include strained silicon patterns and silicon-germanium patterns. Accordingly, as fully described in prior embodiments, the mobility of carriers in a channel region under the fin pattern 218 is increased, and the number of carriers in the channel region are increased due to the strained silicon patterns. The fin pattern 218 can also be formed to a greater height than conventional fin patterns, because the silicon-germanium patterns may act as buffers. As a result, performance of the Fin FET is improved and on-current is increased. In addition, because the bottom surface of the fin pattern 218 makes contact with the support substrate 205, the floating body effect that occurs in SOI substrates is prevented. Also, although heat may occur in the fin pattern 218, the heat can be released into the support substrate 205.

Figure 11:
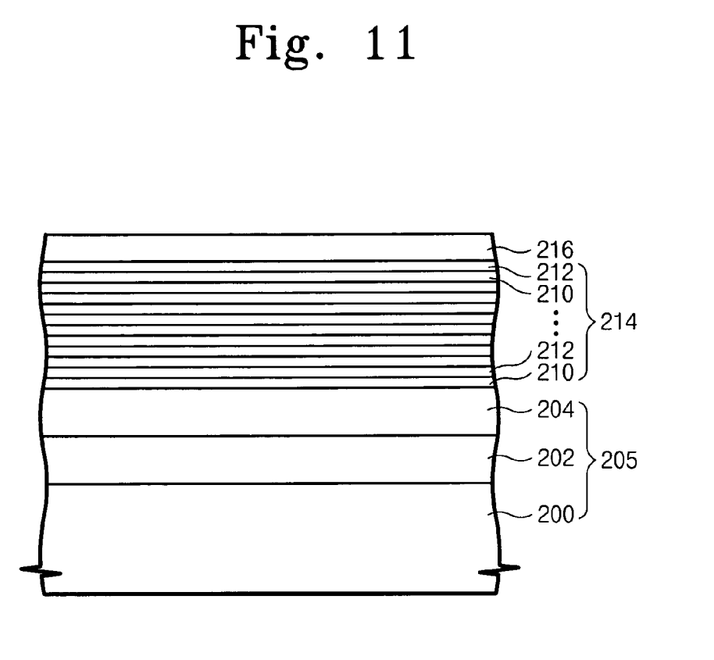
FIG. 11 through FIG. 13 are cross-sectional views illustrating methods of forming the Fin FET shown FIG. 8 according to some embodiments of the invention, taken along with a line IV-IV' of FIG. 8.
Figure 12:
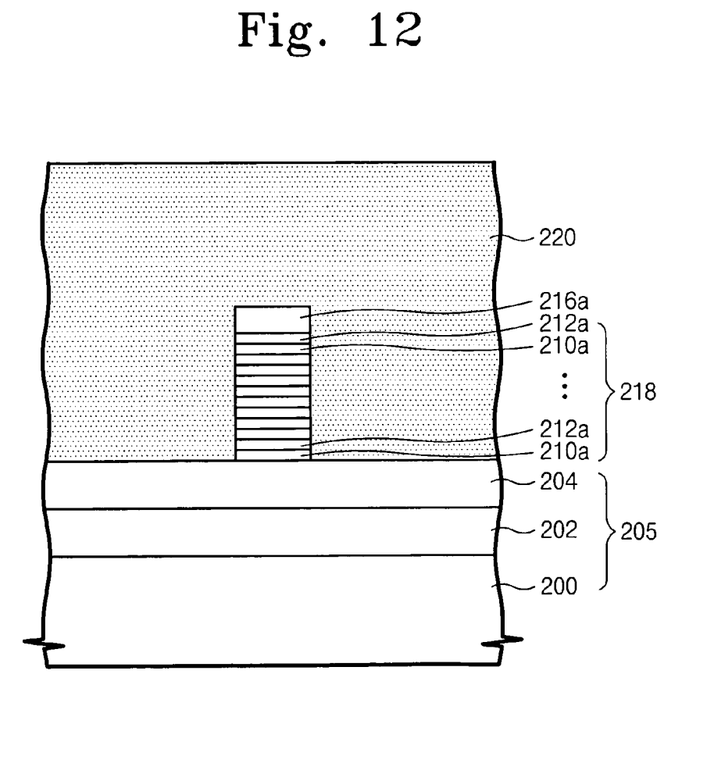
Figure 13:
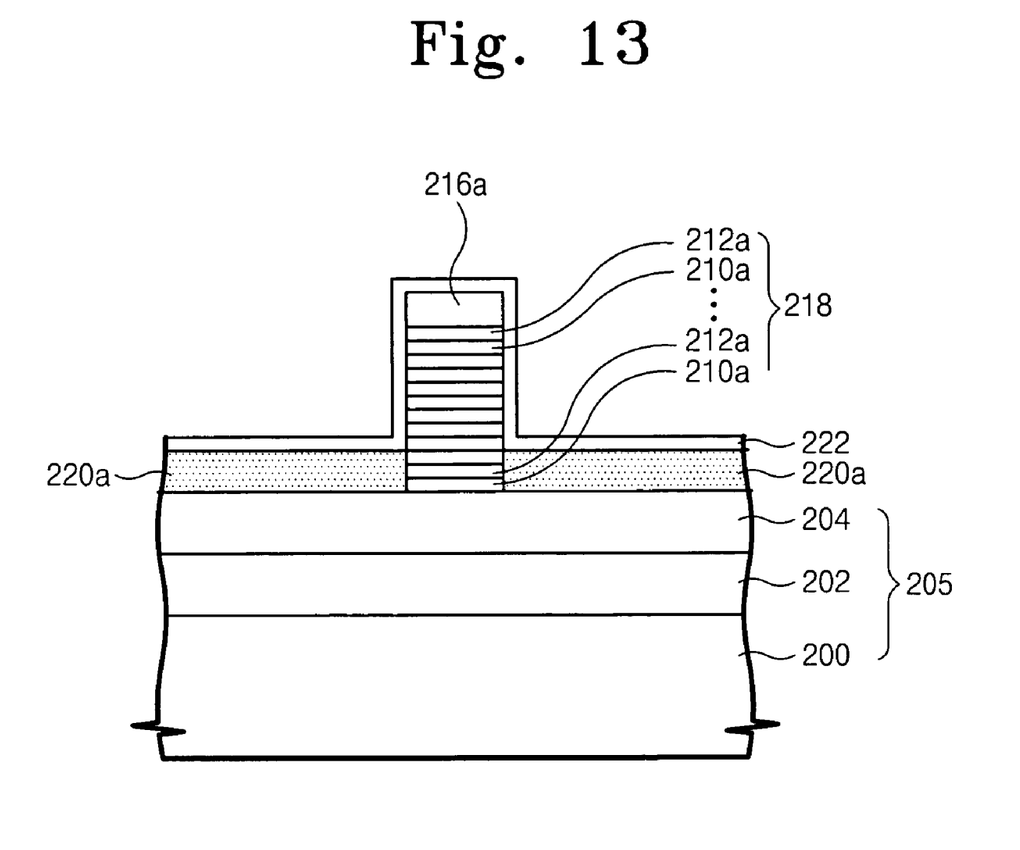

FIG. 11 through FIG. 13 are cross-sectional views illustrating methods of forming the Fin FET shown FIG. 8, taken along line IV-IV' of FIG. 8.

Referring to FIG. 11, a buffer semiconductor layer 202 and a relaxed semiconductor layer 204 are sequentially formed on a semiconductor substrate 200. The semiconductor substrate 200, the buffer semiconductor layer 202, and the relaxed semiconductor layer 204 form a support substrate 205.

Preferably, the semiconductor substrate 200 is made of silicon, the buffer semiconductor layer 202 is made of graded silicon-germanium, and the relaxed semiconductor layer 204 is made of relaxed silicon-germanium. The graded silicon-germanium layer and the relaxed silicon germanium layer may be formed by similar methods as described above with respect to other embodiments.

Still referring to FIG. 11, a multi-level layer 214 is formed on the relaxed semiconductor layer 204, wherein the multi-level layer includes a plurality of first semiconductor layers 210 and second semiconductor layers 212 which are alternately stacked. Preferably, one of the first and second semiconductor layers 210 and 212 is made of strained silicon via an epitaxial growth process using silicon source gases, and the other of the first and second semiconductor layers 210 and 212 is made of silicon-germanium via an epitaxial growth process using silicon source gases and germanium source gases. At this time, the germanium concentration of the silicon-germanium layers in the multi-level layer 214 is the same as the germanium concentration of the relaxed semiconductor layer 204. Accordingly, lattice widths of the silicon-germanium layer and horizontal lattice widths of the strained silicon layer are equal to that of the relaxed semiconductor layer 204.

Topmost and bottommost layers of the multi-level layer 214 may be formed of the same material as the topmost and bottommost layers of the multi-level layer 114 of FIG. 6. A hard mask layer 216 is also formed on the multi-level layer 214.

Referring to FIG. 12, a hard mask pattern 216a and a fin pattern 218 are formed by sequentially patterning the hard mask layer 216 and the multi-level layer 214. The fin pattern 218 includes a plurality of first semiconductor patterns 210a and second semiconductor patterns 212a which are alternately stacked, as shown in FIG. 12.

A device insulation layer 220 is then formed on the support substrate 205 having the fin pattern 218 and the hard mask pattern 216a. The device insulation layer 220 may be made of silicon oxide. The device insulation layer 220 is planarized until a top surface of the hard mask pattern 216a is exposed, and then a device isolation layer 220a is formed by selectively recessing the planarized device insulation layer 220.

Referring to FIG. 13, a top surface of the device isolation layer 220a is lower than a top surface of the fin pattern 218. In other words, the device isolation layer 220a surrounds a lower portion of the fin pattern 218. A bottom surface of the fin pattern 218 is in contact with the relaxed semiconductor layer 204.

Still referring to FIG. 13, a gate insulation layer 222 is formed on the exposed surface of the fin pattern 218 by thermal oxidation. The gate insulation layer 222 may be formed of silicon oxide and germanium oxide. Alternatively, a surface semiconductor layer may be formed on the support substrate 205 having the device isolation layer 220a by chemical vapor deposition (CVD) or an epitaxial growth process, and then the gate insulation layer 222 may be formed by thermal oxidation of the surface semiconductor layer. The surface semiconductor layer may be made of silicon.

The gate electrode 225, as shown in FIG. 8, is then formed on the support substrate 205 having the gate insulation layer 222. Next, a couple of impurity diffusion layers 227, as also shown in FIG. 8, are formed by ion implantation, using the gate electrode 225 as ion mask. The impurity diffusion layers 227 correspond to source and drain regions.

In the all of the above-described embodiments, layers which correspond to each other may be formed of the same materials.

According to some embodiments of the present invention, a Fin FET has a fin pattern including a plurality of first semiconductor patterns and second semiconductor patterns which are alternately stacked. The first and second semiconductor patterns have lattice widths that are greater than lattice width of silicon in at least one direction. Therefore, both the number of carriers and the mobility of carriers in the channel may be increased, so that performance of the Fin FET can be improved. In addition, the first and second semiconductor patterns may be formed of strained silicon and silicon-germanium, respectively, so that the Fin FET may be suitable for use in CMOS devices having both NMOS and PMOS transistors.

In the drawings and specification, there have been disclosed embodiments according to the invention and, although, specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A fin field effect transistor formed on a semiconductor substrate, comprising:
   a fin pattern protruding from the substrate including first and second semiconductor patterns which are stacked;
   wherein the first and second semiconductor patterns have lattice widths that are greater than a lattice width of the substrate material in a direction along a length of a transistor channel in the fin pattern including source/drain regions at opposite sides thereof.

2. The transistor of claim 1, wherein one of the first and second patterns is formed of strained silicon, and the other of the first and second patterns is formed of silicon-germanium.

3. The transistor of claim 1, further comprising a buffer semiconductor layer on the substrate and a relaxed semiconductor layer on the buffer layer.

4. The transistor of claim 1, further comprising:
   a device isolation layer on the substrate surrounding a lower portion of the fin; and
   a gate electrode partially positioned on the device isolation layer.

5. The transistor of claim 1, further comprising a hard mask layer on the fin pattern.

6. The transistor of claim 3, wherein the substrate is formed of silicon, the buffer layer is formed of graded silicon-germanium, and the relaxed layer is formed of silicon-germanium.

7. The transistor of claim 6, wherein the concentration of germanium in the buffer layer gradually increases from bottom to top, and wherein the concentration of germanium in the relaxed layer is uniform and is equivalent with a maximum concentration of germanium in the buffer layer.

8. The transistor of claim 3, wherein one of the first and second patterns is formed of the same material as the relaxed layer.

9. The transistor of claim 3, wherein the fin pattern further includes a third semiconductor pattern formed of the same material as the relaxed layer.

10. A fin field effect transistor formed on a semiconductor substrate, comprising:
    a fin pattern protruding from the substrate including a plurality of first and second semiconductor patterns which are alternately stacked to increase a height of the fin pattern,
    wherein the first and second semiconductor patterns include lattice widths that are greater than a lattice width of the substrate material in at least one direction, and wherein one of the first and second semiconductor patterns reduces stress from another of the first and second semiconductor patterns.

11. A fin field effect transistor, comprising:
    a semiconductor substrate having a first lattice width in a first direction;
    a first semiconductor pattern having a second lattice width in the first direction that is greater than the first lattice width; and
    a second semiconductor pattern having a third lattice width in the first direction that is greater than the first lattice width,
    wherein the first and second patterns are stacked to form a fin pattern protruding from the substrate, and wherein the first direction comprises a direction along a length of a transistor channel in the fin pattern including source/drain regions at opposite sides thereof.

12. A Fin FET comprising:
    a support substrate including a semiconductor substrate, and a buffer semiconductor layer and a relaxed semiconductor layer which are stacked on the semiconductor substrate;
    a fin pattern including a multi-layered pattern on the support substrate, wherein the multi-layered pattern includes a plurality of first semiconductor patterns and second semiconductor patterns which are alternately stacked;
    a gate electrode crossing over the fin pattern;
    a gate insulation layer positioned between the fin pattern and the gate electrode; and
    at least one impurity diffusion layer in the fin pattern on both sides of the gate electrode,
    wherein the first and second semiconductor patterns have lattice widths directionally wider than a lattice width of silicon, and wherein one of the first and second semiconductor patterns reduces stress from another of the first and second semiconductor patterns.

* * * * *